United States Patent
Smith et al.

(10) Patent No.: US 10,473,699 B1
(45) Date of Patent: Nov. 12, 2019

(54) SYSTEMS AND METHODS FOR CONTROLLING MOSFETS

(71) Applicant: Control4 Corporation, Salt Lake City, UT (US)

(72) Inventors: Gregory Scott Smith, Woods Cross, UT (US); Sidney Lyle King, North Logan, UT (US); Robert Don Bruhn, Jr., West Jordan, UT (US)

(73) Assignee: Control4 Corporation, Salt Lake City, UT (US)

( * ) Notice: Subject to any disclaimer, the term of this patent is extended or adjusted under 35 U.S.C. 154(b) by 0 days.

(21) Appl. No.: 16/140,168

(22) Filed: Sep. 24, 2018

Related U.S. Application Data

(60) Provisional application No. 62/727,239, filed on Sep. 5, 2018.

(51) Int. Cl.
*G01R 19/165* (2006.01)
*H03K 17/22* (2006.01)
*H03K 17/082* (2006.01)
*H05B 33/08* (2006.01)
*H03K 17/16* (2006.01)
H03K 17/08 (2006.01)

(52) U.S. Cl.
CPC ... *G01R 19/16519* (2013.01); *H03K 17/0822* (2013.01); *H03K 17/165* (2013.01); *H03K 17/223* (2013.01); *H05B 33/0848* (2013.01); H03K 2017/0806 (2013.01)

(58) Field of Classification Search
CPC ......... G01R 19/16519; H03K 17/0822; H03K 17/165; H03K 17/223
See application file for complete search history.

(56) References Cited

U.S. PATENT DOCUMENTS

| 7,560,973 | B2 * | 7/2009 | Rincon-Mora | ........... H03F 3/21 327/427 |
| 2013/0257406 | A1 * | 10/2013 | Hausman, Jr. | ............ G05F 5/00 323/300 |

* cited by examiner

*Primary Examiner* — Daniel C Puentes
(74) *Attorney, Agent, or Firm* — Austin Rapp

(57) ABSTRACT

An electronic device is described. The electronic device includes line voltage measuring circuitry configured to measure a line voltage to produce a line voltage measurement. The electronic device also includes load voltage measuring circuitry configured to measure a load voltage to produce a load voltage measurement. The electronic device further includes a processor coupled to the line voltage measuring circuitry and the load voltage measuring circuitry. The processor is configured to adjust a voltage ramp waveform for a transition of a first metal-oxide-semiconductor field-effect transistor (MOSFET) and a second MOSFET based on the line voltage measurement and the load voltage measurement to minimize heat generation and electromagnetic interference creation by the MOSFETs. The first MOSFET and the second MOSFET control a current to a load in an alternating current configuration.

18 Claims, 10 Drawing Sheets

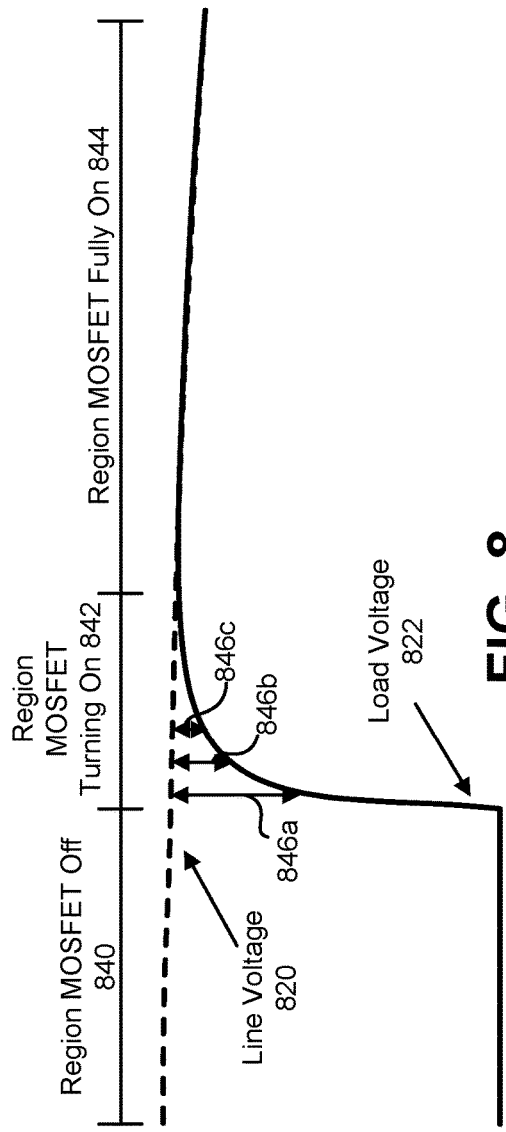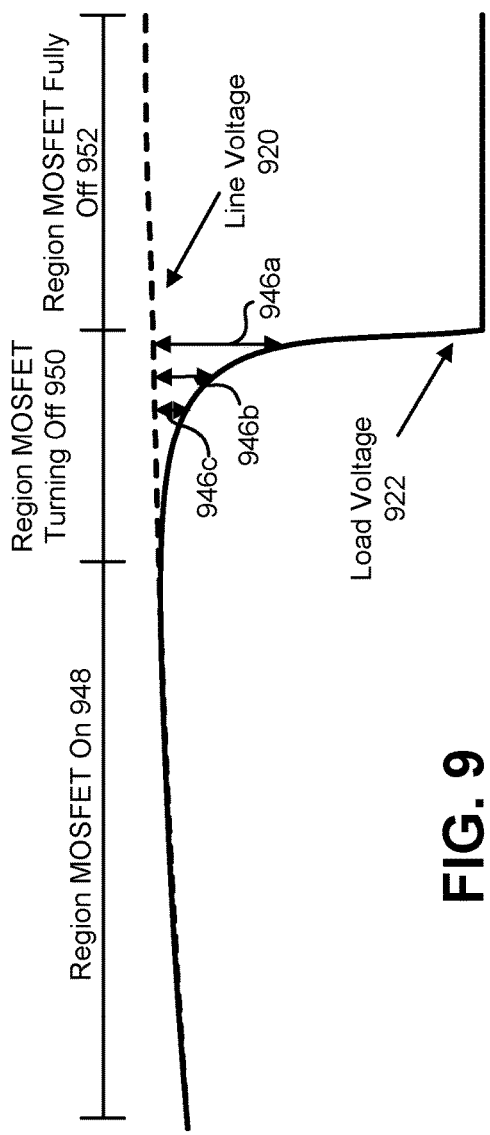

SYSTEMS AND METHODS FOR CONTROLLING MOSFETS

RELATED APPLICATIONS

This application is related to and claims priority from U.S. Provisional Patent Application Ser. No. 62/727,239, filed Sep. 5, 2018, for "SYSTEMS AND METHODS FOR CONTROLLING MOSFETS," with first named inventor Gregory Scott Smith.

TECHNICAL FIELD

The present disclosure relates generally to electronic devices. More specifically, the present disclosure relates to systems and methods for controlling metal-oxide-semiconductor field-effect transistors (MOSFETs).

BACKGROUND

In recent years, the price of electronic devices has decreased dramatically. In addition, the size of electronic devices has continued to decrease. Further, electronic devices continue to increase in capability and convenience.

Decreasing prices and increasing capabilities of electronic devices has permitted modern devices to be conveniently used in homes and businesses. Many homes and businesses include multiple electronic devices to assist in everyday tasks. For example, electronic devices may be used for convenience and/or entertainment.

While some electronic devices may provide convenience and entertainment, many also require control. Moreover, these electronic devices consume electrical power. Safety is also a concern with some electronic devices. As can be observed from this discussion, improvements to electronic device ease of use, efficiency and/or safety may be beneficial.

BRIEF DESCRIPTION OF THE DRAWINGS

FIG. 8 illustrates a difference approach for adjusting the voltage ramp waveform to a MOSFET gate for an off/on transition;

FIG. 9 illustrates a difference approach for adjusting the voltage ramp waveform to a MOSFET gate for an on/off transition;

DETAILED DESCRIPTION

Figure 1:
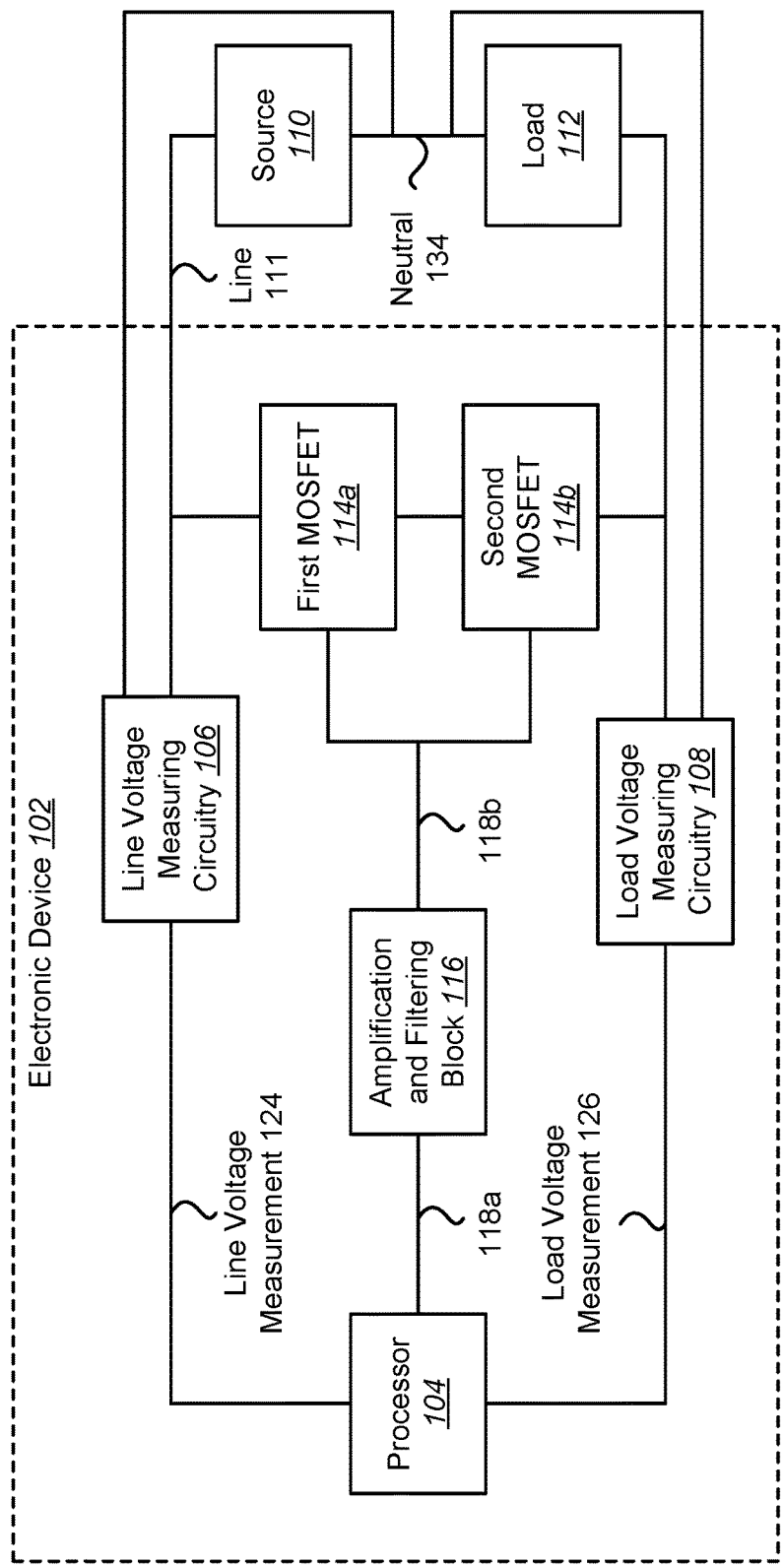
FIG. 1 is a block diagram illustrating one configuration of an electronic device for controlling metal-oxide-semiconductor field-effect transistors (MOSFETs)

An electronic device is described. The electronic device includes line voltage measuring circuitry configured to measure a line voltage to produce a line voltage measurement. The electronic device also includes load voltage measuring circuitry configured to measure a load voltage to produce a load voltage measurement. The electronic device further includes a processor coupled to the line voltage measuring circuitry and the load voltage measuring circuitry. The processor is configured to adjust a voltage ramp waveform for a transition of a first metal-oxide-semiconductor field-effect transistor (MOSFET) and a second MOSFET based on the line voltage measurement and the load voltage measurement to minimize heat generation and electromagnetic interference creation by the MOSFETs. The first MOSFET and the second MOSFET control a current to a load in an alternating current configuration.

The processor may provide the voltage ramp waveform to an amplification and filtering block coupled to a gate input of the first MOSFET and a gate input of the second MOSFET. The processor may adjust the voltage ramp waveform in real time based on the line voltage measurement and the load voltage measurement.

The processor may adjust the voltage ramp waveform to round final stages of an off/on transition or an on/off transition of the MOSFETs. The voltage ramp waveform may include a fast transition during initial stages of an off/on transition to minimize heat generation by the MOSFETs and a rounded transition in the final stages of the off/on transition to reduce electromagnetic interference.

The processor may adjust the voltage ramp waveform using the equation $\log(\text{time})^X$, where X is based on a size of the load. X may vary between 0.1 and 1. The voltage ramp waveform may include a duration between 100 microseconds and 1000 microseconds. A voltage scale of the voltage ramp waveform may be based on a size of the load.

The processor may adjust the voltage ramp waveform lower when the load voltage measurement develops a sharp edge at the beginning of the voltage ramp waveform. The processor may adjust the voltage ramp waveform higher when the load voltage measurement develops a notch at the end of the voltage ramp waveform.

The processor may adjust the voltage ramp waveform based on a difference between the line voltage measurement and the load voltage measurement. The processor may adjust a starting voltage of the voltage ramp waveform until a difference between the line voltage measurement and the load voltage measurement is within a threshold at a number of points during the transition of the MOSFETs.

A method is also described. The method includes measuring a line voltage to produce a line voltage measurement. The method also includes measuring a load voltage to produce a load voltage measurement. The method further includes adjusting a voltage ramp waveform for a transition of a first MOSFET and a second MOSFET based on the line voltage measurement and the load voltage measurement to minimize heat generation and electromagnetic interference creation by the MOSFETs. The first MOSFET and the second MOSFET control a current to a load in an alternating current configuration.

A non-transitory computer-readable medium is also described. The computer-readable medium includes executable instructions for measuring a line voltage to produce a line voltage measurement. The computer-readable medium also includes executable instructions for measuring a load voltage to produce a load voltage measurement. The computer-readable medium includes executable instructions for adjusting a voltage ramp waveform for a transition of a first MOSFET and a second MOSFET based on the line voltage measurement and the load voltage measurement to minimize heat generation and electromagnetic interference creation by the MOSFETs. The first MOSFET and the second MOSFET control a current to a load in an alternating current configuration.

Some of the configurations of the systems and methods disclosed herein may relate to controlling MOSFETs. For example, some configurations of the systems and methods disclosed herein may provide approaches for detecting and driving power MOSFETs to efficiently reduce electromagnetic interference and temperature. In some approaches, an electronic device (e.g., dimmer) may include one or more MOSFETs for controlling power (e.g., voltage and/or current) to a load (e.g., lighting load).

MOSFETs may be used to dim lights in a configuration where the MOSFETs either block or allow voltage and current to pass from the power lines to the lighting loads. An efficient way to do this is to turn the MOSFETs on and off as quickly as possible because MOSFETs consume power internally when transitioning from off to on and back to off. However, a drawback to this quick switching is the creation of electromagnetic interference, which can be disruptive to other electronic devices and can exceed limits imposed by governmental regulatory agencies. In some approaches, the switching circuitry transition may be slowed down intentionally to reduce electromagnetic interference but at a cost of consuming more power within the switching circuitry and degrading the load driving potential of the MOSFETs.

In some approaches, a MOSFET driver may make sharp jumps from a low voltage to a high voltage to turn the MOSFETs on and a high voltage to a low voltage to turn the MOSFETs off. With alternating current, two MOSFETs may be employed in a configuration where a first MOSFET controls the current to the load and a second MOSFET is used to control the current coming from the load. The MOSFET driver may be connected to the gates of the MOSFETs, which drives them to turn on and off at a rate needed for the desired dimming level.

In some approaches, electromagnetic interference may be reduced from these turn on and turn off transitions by placing a resistor between the MOSFET driver and the MOSFET gates. These resistors interact with the built-in capacitance of the MOSFETs to slow the switching time seen at the gates, thus slowing the MOSFET's delivery of voltage to the lighting load. A larger resistor (e.g., a resistor with a higher resistor value) may result in a slower switching time as compared to a smaller resistor (e.g., a resistor with a smaller resistor value). The resistor value may be picked large enough to balance reduced electromagnetic interference with acceptable lowered efficiency. However, this circuit does not have precise control over the switching behavior of the MOSFET because the ramping behavior at the MOSFET gate follows a charge up of a capacitor through a resistor, which causes the ramp to be slower in sections than needed. To lower electromagnetic interference, extra unintended energy is consumed in the MOSFET, which self-heats the MOSFET and decreases its driving potential.

The systems and methods described herein provide for actively adjusting a ramp on the gate of a MOSFET while detecting the response of the MOSFET with a given load. As used herein, the terms "ramp" or "voltage ramp" refer to a voltage waveform. A processor (e.g., CPU) may adjust a specific narrow voltage ramp in real time based on feedback circuitry so the final stages of the on/off transition of the MOSFET are rounded. If left sharp, the final stages of this transition may create significant amounts of electromagnetic interference. The systems and methods described herein may be used to keep the MOSFET transition as quick as possible while rounding this sharp point of the load voltage. This allows the MOSFET to run cool while keeping the production of electromagnetic interference relatively low.

Some of the configurations described herein may provide one or more benefits. For example, dynamically controlling the gates of the MOSFETs may allow the MOSFETs to run more wattage load while running at the same temperatures as a traditional setup. This allows a dimming product to have higher lighting wattage load ratings while using the same sized MOSFETs as a traditional setup. Furthermore, this allows MOSFETs to be smaller and cheaper while maintaining the same wattage load rating of a traditional setup.

As used herein, the term "couple" and other variations thereof (e.g., "coupled," "coupling," etc.) may mean that one element is connected to another element directly or indirectly. For example, if a first element is coupled to a second element, the first element may be connected directly to the second element (without any intervening element, for example) or may be connected to the second element through one or more other elements. Lines in one or more of the Figures (e.g., in the block diagrams) may indicate couplings.

Various configurations are now described with reference to the figures, where like reference numbers may indicate functionally similar elements. The systems and methods as generally described and illustrated in the figures herein could be arranged and designed in a wide variety of different configurations. Thus, the following more detailed description of several configurations, as represented in the Figures, is not intended to limit scope, as claimed, but is merely representative of the systems and methods. As used herein, the term "plurality" may indicate two or more. For example, a plurality of components may refer to two or more components.

FIG. 1 is a block diagram illustrating one configuration of an electronic device 102 for controlling metal-oxide-semiconductor field-effect transistors (MOSFETs) 114. The electronic device 102 may include a processor 104, line voltage measuring circuitry 106, load voltage measuring circuitry 108, an amplification and filtering block 116, a first MOSFET 114*a* and a second MOSFET 114*b*. Collectively, the first MOSFET 114*a* and the second MOSFET 114*b* may be referred to as MOSFETs 114. The processor 104 may be coupled to the line voltage measuring circuitry 106, the load voltage measuring circuitry 108, to the amplification and filtering block 116 and/or to the MOSFETs 114 (via the amplification and filtering block 116, for instance).

Examples of electronic devices 102 include electronic circuits, integrated circuits, circuits with discrete components (e.g., resistors, capacitors, transistors, MOSFETs, etc.), computers, and/or devices that include one or more processors, memory cells, latches, logic gates, etc. For instance, the electronic device 102 may be a switch and/or a dimmer that includes discrete components and a processor 104 (e.g., microprocessor) that may be used to control switching circuitry. The processor 104 may include and/or access software in memory and/or firmware. For example, the electronic device 102 may include memory. The memory may be included on-board the processor 104 or may be separate from the processor 104. The memory may store instructions and/or data (e.g., samples, voltage samples, and/or current samples, etc.). Additionally or alternatively, the memory or a separate memory may store firmware. In some configurations, the electronic device 102 may be a semiconductor-based dimmer (e.g., a MOSFET-based dimmer). In some configurations, the electronic device 102 may be housed within a wall box. In some configurations, the electronic device 102 may be housed within a panel (e.g., lighting panel).

The electronic device 102 may be coupled to a source 110 (e.g., an alternating current (AC) voltage source) and/or to a load 112. For example, the electronic device 102 may be coupled to the source 110 on a line 111 coupling (e.g., line 111 terminal) and a neutral 134 coupling (e.g., neutral 134 terminal). For example, an AC voltage may be provided to the electronic device 102 through the feed line 111. In some configurations, the source 110 may output an AC voltage (e.g., 240 volts (V), 120 V, etc.). The AC voltage may be provided to the electronic device 102 between the line 111 (e.g., "hot") and neutral 134. The voltage between the line 111 and neutral 134 may be referred to as line voltage.

The electronic device 102 may be coupled to a load 112. For example, the MOSFETs 114 of the electronic device 102 may be coupled to the load 112. With alternating current, two MOSFETs 114 may be employed in a configuration where a first MOSFET 114a controls the current to the load 112 and the second MOSFET 114b is used to control the current coming from the load 112. The load 112 may also be coupled to the electronic device 102 at neutral 134 (e.g., a neutral line). The MOSFETs 114 may activate or deactivate the load 112.

Some load types may include inductive, capacitive, and resistive load types. Inductive load types may have a magnetic inductor of some sort. One example of an inductive load is a magnetic transformer for low voltage (e.g., magnetic low voltage (MLV)) lighting. Inductive load types may have a waveform characteristic in which the phase of the current lags (e.g., comes after) the voltage waveform. However, some inductive loads may have very little current lag. For example, some toroidal MLV loads may have power factors that are very close to 1 (where resistive loads may have a power factor of 1).

Capacitive load types may have a detectable amount of capacitance. Examples of capacitive loads are dimmable fluorescent lights and electronic low voltage (ELV) lighting. Capacitive load types may have a waveform characteristic in which the phase of the current leads (e.g., comes before) the voltage waveform. However, some capacitive loads may exhibit a different waveform characteristic due to a power supply. For example, some capacitive loads may have a waveform characteristic in which the phase of the current lags a voltage waveform (e.g., line voltage waveform) due to an activation delay resulting from a power supply.

Resistive load types may exhibit current and voltage waveforms in phase with each other. For example, there may be no significant (e.g., discernible) lead or lag between current and voltage in resistive load types. Examples of resistive loads include incandescent and halogen lights.

The electronic device 102 (e.g., processor 104 and/or MOSFETs 114) may control the amount of power delivered to the load 112. In some configurations (e.g., switch, dimmer, etc.), the MOSFETs 114 may turn on (e.g., activate) the power or turn off (e.g., deactivate) the power to the load 112. Additionally or alternatively, the electronic device 102 (e.g., processor 104 and/or MOSFETs 114) may adjust the amount of power that is delivered to the load 112 (e.g., enable, disable, adjust duty cycle, cut phase, increase phase, etc.).

The MOSFETs 114 may include a controlling gate input. A voltage ramp waveform 118b received at the controlling gate input may cause the MOSFETs 114 to transition from an off to an on state or from an on state to an off state.

In some configurations, the electronic device 102 may be a dimmer and/or may include a dimmer. For example, the MOSFETs 114 may activate and/or deactivate the load 112 (periodically and/or cyclically, for instance) in order to achieve a particular dimming level. This may be referred to as "phase-cut" dimming, where different amounts (e.g., time segments, portions, etc.) of load voltage may be cut (e.g., deactivated) in order to produce different dimming levels. When no portion of the load voltage is cut, the load 112 may be driven in a fully activated state, where the full cycle of load voltage is provided. This may be referred to as a "full-on" (e.g., 100%) dimming level (e.g., a dimming level of no dimming). A range of cycle portions may be cut according to dimming level. For example, a half (e.g., 50%) dimming level may cut approximately half of the load voltage cycle. Other dimming levels (e.g., 0%, 25%, 33%, 75%, 90%, etc.) may similarly be achieved by controlling the MOSFETs 114 to cut corresponding portions from the load voltage cycle.

A line voltage may be a voltage on the line 111 (e.g., between line couplings, between line terminals, between the MOSFETs 114 and neutral 134, etc.). The line voltage measuring circuitry 106 is configured to measure the line voltage (i.e., the voltage across the source 110) to produce a line voltage measurement 124 (e.g., a voltage waveform). For example, the line voltage measuring circuitry 106 may continuously capture the line voltage measurement 124 (e.g., voltage waveform) by sampling the line voltage for one or more cycles of AC voltage (across the source 110, for instance). The line voltage measuring circuitry 106 may have a reference to the line 111 and a reference to neutral 134. The measured line voltage and/or line voltage measurement 124 may be provided to the processor 104. The line voltage measuring circuitry 106 may include discrete components (e.g., one or more resistors, capacitors, transistors, amplifiers, chip packages, etc.). In some configurations, the line voltage measuring circuitry 106 may only include discrete components.

In some configurations, the line voltage measuring circuitry 106 may capture a continuous time (e.g., analog) voltage waveform. The continuous time voltage waveform may represent how the line voltage varies over each cycle. In some configurations, the electronic device 102 may include and/or utilize an analog-to-digital converter (ADC) for capturing a discrete time (e.g., digital) voltage waveform of the line voltage by sampling the continuous time voltage waveform. For example, the ADC may sample at sufficient intervals to capture how the line voltage varies over one or more cycles. A digital voltage waveform may be one example of the line voltage measurement 124.

A load voltage may be a voltage between electronic device 102 lines for a load 112 (e.g., between load couplings, between load terminals, between the MOSFETs 114 and neutral 134, etc.). The load voltage measuring circuitry 108 is configured to measure the load voltage (i.e., the voltage across the load 112) to produce a load voltage measurement 126 (e.g., a voltage waveform). For example, the load voltage measuring circuitry 108 may continuously capture the load voltage measurement 126 (e.g., voltage waveform) by sampling the load voltage for one or more cycles of AC voltage (across the load 112, for instance). The load voltage measuring circuitry 108 may have a reference between the second MOSFET 114b and the load 112. The load voltage measuring circuitry 108 may also have a reference to neutral 134. The measured load voltage and/or load voltage measurement 126 may be provided to the processor 104. The load voltage measuring circuitry 108 may include discrete components (e.g., one or more resistors, capacitors, transistors, amplifiers, chip packages, etc.). In some configurations, the load voltage measuring circuitry 108 may only include discrete components.

In some configurations, the load voltage measuring circuitry 108 may capture a continuous time (e.g., analog) voltage waveform. The continuous time voltage waveform may represent how the load voltage varies over each cycle. In some configurations, the electronic device 102 may include and/or utilize an analog-to-digital converter (ADC) for capturing a discrete time (e.g., digital) voltage waveform of the load voltage by sampling the continuous time voltage waveform. For example, the ADC may sample at sufficient intervals to capture how the load voltage varies over one or more cycles. A digital voltage waveform may be one example of the load voltage measurement 126.

It should be noted that the load voltage measurement 126 may be distinct from the line voltage measurement 124. For example, the load voltage measurement 126 may indicate a load voltage across a load 112, while a line voltage measurement 124 may indicate a line voltage across a source 110. In some configurations, the load voltage may be on a different side of the MOSFETs 114 than the line voltage. For example, the line voltage may be taken from the line 111 feed of the electronic device 102 (e.g., on the "front" side of the MOSFETs 114), while the load voltage may be taken from across the load 112 (e.g., on the "back" side of the MOSFETs 114).

In some configurations, the processor 104 may adjust a voltage ramp waveform 118a for a transition of the MOSFETs 114 based on the line voltage measurement 124 and the load voltage measurement 126 to minimize heat generation and electromagnetic interference creation by the MOSFETs 114. For example, the processor 104 may generate a voltage ramp waveform 118a to cause the MOSFETs 114 to switch on and off at a controlled transition rate to reduce the power delivered to a load 112 (e.g., lighting load). The voltage ramp waveform 118a may be sent to a controlling gate input of the MOSFETs 114.

In some implementations, the processor 104 may provide the voltage ramp waveform 118a to an amplification and filtering block 116 coupled to the controlling gate input of the first MOSFET 114a and a gate input of the second MOSFET 114b. For example, the amplification and filtering block 116 may be implemented as an operational amplifier (op-amp). The voltage ramp waveform 118a produced by the processor 104 may have discrete steps. The amplification and filtering block 116 may amplify the voltage ramp waveform 118a to voltage levels that are sufficient to drive the transition of the MOSFETs 114. The amplification and filtering block 116 may also smooth the steps of the voltage ramp waveform 118a using filtering. The amplified and filtered voltage ramp waveform 118b (e.g., voltage waveform) may be provided to the MOSFETs 114. It should be noted that the voltage ramp waveform 118a generated by the processor 104 and the amplified and filtered voltage ramp waveform 118b may be individually or collectively referred to as a voltage ramp waveform 118.

In some implementations, the processor 104 causes a digital-to-analog converter (DAC) (not shown) to output the voltage ramp waveform 118a. Therefore, voltage ramp waveform 118a provided to the amplification and filtering block 116 may be an analog signal. The processor 104 may adjust the output of the DAC based on the line voltage measurement 124 and the load voltage measurement 126 to minimize heat generation and electromagnetic interference creation by the MOSFETs 114.

The processor 104 may adjust the voltage ramp waveform 118a in real time based on feedback from the line voltage measuring circuitry 106 and/or load voltage measuring circuitry 108. For example, a transition rate to transition the MOSFETs 114 from an on state to an off state or an off state to an on state may be determined by the processor 104 based on the line voltage measurement 124 and the load voltage measurement 126. The transition rate may be determined based on the line voltage measurement 124 and the load voltage measurement 126 to minimize heat generation and electromagnetic interference creation by the MOSFETs 114.

In some implementations, the processor 104 may adjust the voltage ramp waveform 118a to round final stages of an off/on transition or an on/off transition of the MOSFETs 114. For an off/on transition, the voltage ramp waveform 118 may include a fast transition during initial stages of the off/on transition to minimize heat generation by the MOSFETs 114 and a rounded transition in the final stages of the off/on transition to reduce electromagnetic interference. For an on/off transition, the voltage ramp waveform 118 may include a rounded transition during initial stages of the on/off transition to reduce electromagnetic interference and a fast transition in the final stages of the off/on transition to minimize heat generation by the MOSFETs 114.

In some implementations, the processor 104 may use the equation $\log(time)^X$ (referred to herein as the voltage ramp equation), where X is based on a size of the load 112. X may vary between 0.1 to 1 created over a voltage scale of 0.5 volts to 1.5 volts. The processor 104 may generate the voltage ramp waveform 118a for a time duration. In some implementations, the time duration of the voltage ramp waveform 118a may be between approximately 100 microseconds (us) to 1000 us.

These variables (e.g., X, the voltage scale and/or the duration) may change depending on the size of the load 112 (e.g., lighting load), which can be determined by current sense circuitry (not shown). In some implementations, loads greater than 200 watts (W) may use smaller values of X ranging from 0.1 to 0.5 built over 1.5 volts. Loads under 200 W may use values of X ranging from 0.4 to 1 built over 0.5V. For reverse phase, the processor 104 may add an additional amount of time of slow ramping prior to applying the voltage ramp equation to allow the MOSFETs 114 to discharge their gate capacitance to the point where they are controllable.

The processor 104 may generate the values of the voltage ramp waveform 118a in discrete voltage levels, which are amplified and smoothed (e.g., filtered) by the amplification and filtering block 116. The amplified and filtered voltage ramp waveform 118b may be fed to the gates of the MOSFETs 114.

Figure 4:
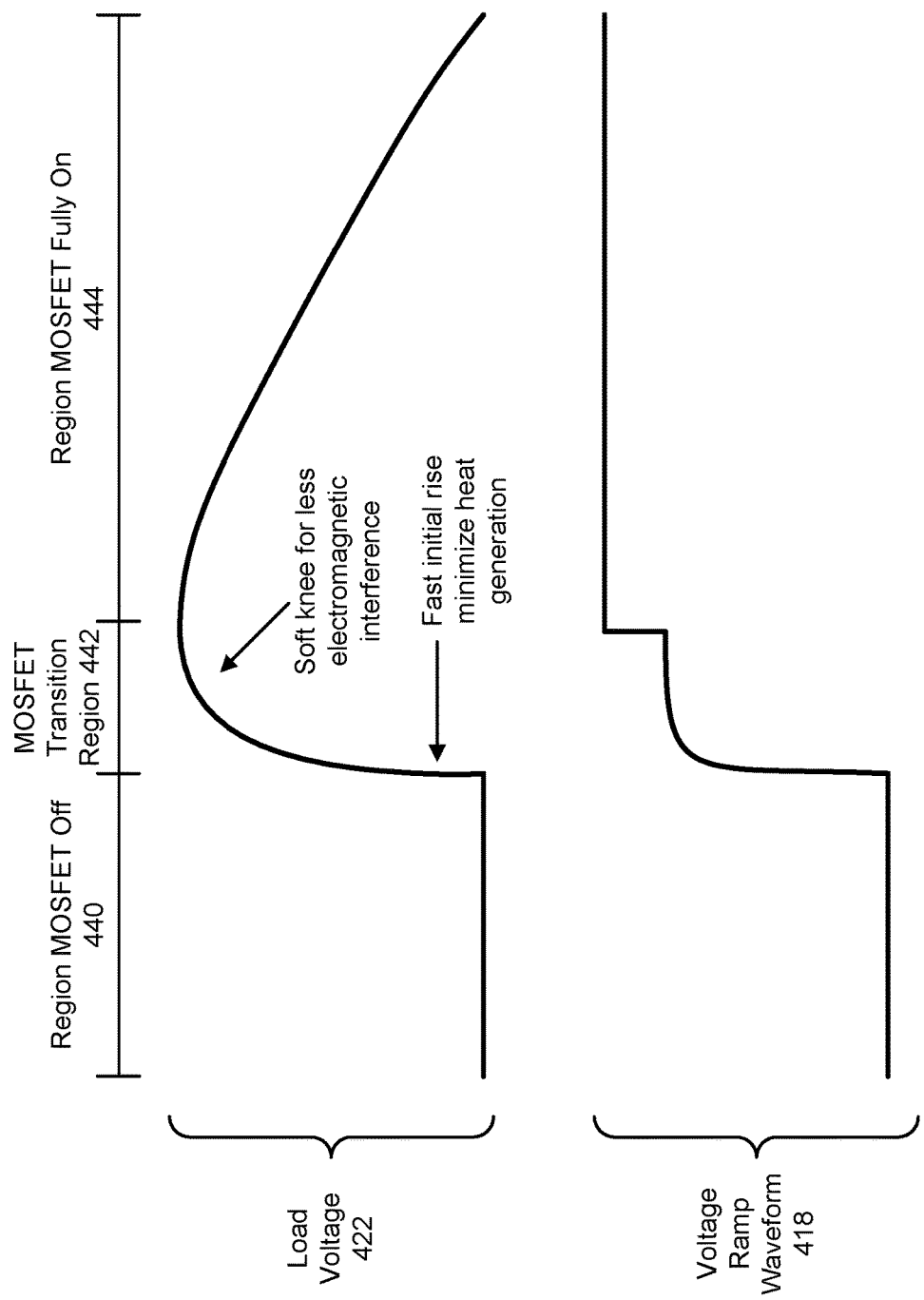
FIG. 4 illustrates an example of the voltage ramp waveform and a resulting load voltage.

The shape of the voltage ramp waveform 118 may turn the MOSFETs 114 on and off in a more efficient manner while reducing electromagnetic interference. An example of a voltage ramp waveform 118 based on the voltage ramp equation is illustrated in FIG. 4.

The turn on behavior and turn on point may depend on the particular MOSFET 114 model, tolerances between MOSFETs 114 of the same model and/or the type of load 112 (e.g., lighting load). In some implementations, the MOSFETs 114 may turn on over a narrow range of approximately 1 volt to 2 volts. The processor 1104 may use the line voltage measurement 124 and/or load voltage measurement 126 as feedback to identify this narrow turn on point of each of the two MOSFETs 114 and to ensure the load voltage is as smooth as possible to reduce electromagnetic interference. The processor 104 may adjust the voltage level where the log(time)$^x$ shape starts by looking at the resultant load voltage.

Figure 6:
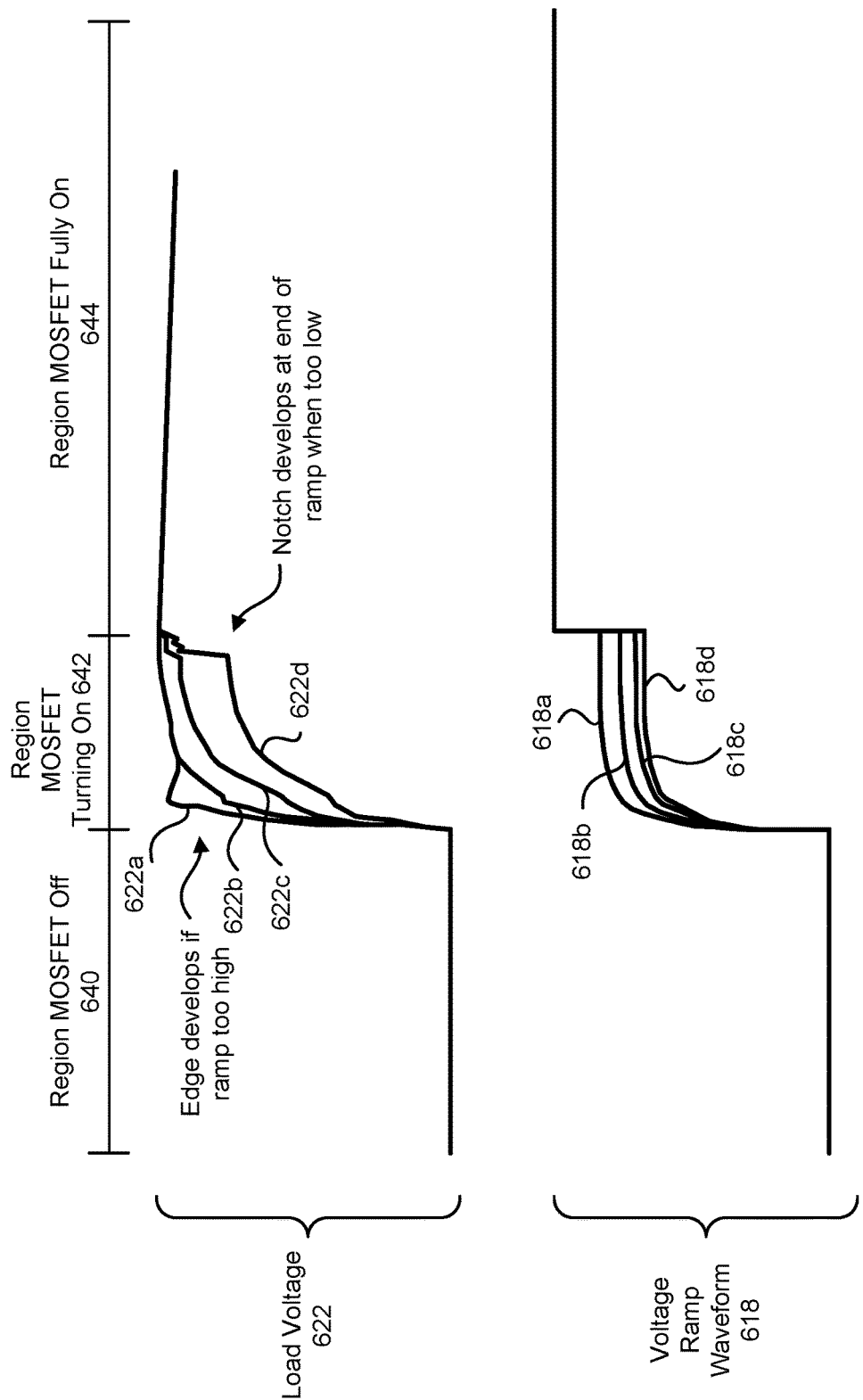
FIG. 6 illustrates a notch approach for adjusting the voltage ramp waveform to a MOSFET gate.

The processor 104 may employ different ways to adjust the voltage ramp waveform 118 based on the response of the MOSFETs 114. In an approach, the processor 104 may adjust the voltage ramp waveform 118 based on the shape of the load voltage measurement 126. In this approach, the processor 104 may determine the proper point to apply the voltage ramp waveform 118 based on the shape of the load voltage measurement 126. For example, the processor 104 may adjust the voltage ramp waveform 118 lower (e.g., offset voltage ramp waveform 118 down) when the load voltage measurement 126 develops a sharp edge at the beginning of the voltage ramp waveform 118. The processor 104 may adjust the voltage ramp waveform 118 higher (e.g., offset voltage ramp waveform 118 up) when the load voltage measurement 126 develops a notch at the end of the voltage ramp waveform 118. This approach may be referred to as the notch approach. FIG. 6 illustrates an example of this notch approach.

In another approach, the processor 104 may adjust the voltage ramp waveform 118 based on a difference between the line voltage measurement 124 and the load voltage measurement 126 at one or more specific times. The window when the processor 104 determines the difference between the line voltage measurement 124 and the load voltage measurement 126 may correspond to the transition region when the MOSFETs 114 are turning on or turning off. The processor 104 may adjust a starting voltage of the voltage ramp waveform 118 until the difference between the line voltage measurement 124 and the load voltage measurement 126 is within a threshold at a number of points during the transition of the MOSFETs 114. This approach may be referred to as the difference approach. FIG. 8 and FIG. 9 illustrate an example of this difference approach.

The notch approach and the difference approach may be used independent of or in combination with each other. The difference approach may be beneficial in noisy power line environments. Any noise on the power line 111 rides on both the line voltage and load voltage. The difference between the line and load voltages does not include the power line noise. This allows the processor 104 to measure the difference between the line voltage and load voltage during the on/off MOSFET transitions without power line noise skewing the results.

As seen by these examples, because the processor 104 is in precise constant control of the voltage ramp waveform 118a to the on/off control input of the MOSFETs 114, the processor 104 may adjust the voltage ramp waveform 118a to cause the MOSFETs 114 to transition as quickly as possible to minimize heat generation. The processor 104 may also adjust the voltage ramp waveform 118a by shaping sections of the transition to minimize electromagnetic interference creation.

In some configurations, the electronic device 102 may be housed in a wall box or lighting panel. For example, the electronic device 102 may be configured to be contained within a wall box as an electrical device. A wall box (e.g., electrical box, outlet box, switch box, pattress, etc.) is the container for the body of an electrical device (e.g., light switch, power outlet, dimmer, etc.). While housed in the wall box, the face of the electrical device may be approximately flush with a wall. In general, the width of a wall box may be measured in "gangs," which indicates the number of electrical devices (e.g., light switches, power outlets, dimmers, etc.) that the wall box can hold. For example, a single-gang wall box may hold a single electrical device and a double-gang wall box may hold two electrical devices (side by side, for example). The depth of a wall box may be standard depth, shallow depth, or deep depth. In some configurations of the systems and methods disclosed herein, a wall box may be a single-gang standard depth wall box and a wall box device may be an electronic device 102 that may be held in a single-gang standard depth wall box. In one configuration, a European style wall box having a width of 86 millimeters, a height of 86 millimeters and a depth of 35 millimeters may be used. In another configuration, a United States style, single-gang, standard depth wall box may be used. It should be noted that other configurations of the systems and methods disclosed herein may not be housed in a wall box. For example, some configurations of the systems and methods disclosed herein may be implemented in lighting devices that are not housed in wall boxes. Additionally or alternatively, a spacer may be utilized in some configurations that places a portion of the device (e.g., an electronic device 102) outside of a wall box.

A wall box dimmer is another example of an electronic device 102 with variable states that may be used to control a load 112. A wall box dimmer may variably adjust the amount of electrical power that is driven to the load 112 (e.g., by adjusting the root mean square (RMS) voltage, adjusting pulse-width modulation, adjusting duty cycle, adjusting a phase cut, etc.). For example, a wall box dimmer may provide 0% electrical power, 100% electrical power or some percentage in between. In one configuration, a wall box dimmer may use one or more semiconductors (e.g., MOSFETs, transistors, etc.) to control the load 112. A simple example of a wall box dimmer is a light dimmer that may turn on or off and variably control the brightness of a light. For example, the light dimmer may increase the brightness of the light by increasing the amount of electrical power driven to the light. Similarly, the light dimmer may decrease the brightness of the light by decreasing the amount of electrical power driven to the light. In some configurations, the wall box device may include switching and dimming capabilities.

It should be noted that one or more of the elements or components described in relation to FIG. 1 may be combined and/or divided in some configurations. For example, the MOSFETs 114, processor 104, amplification and filtering block 116, line voltage measuring circuitry 106, and/or load voltage measuring circuitry 108 may be divided into smaller elements or components that perform a subset of the functions described herein. Additionally or alternatively, one or more of the MOSFETs 114, processor 104, amplification and filtering block 116, line voltage measuring circuitry 106, and/or load voltage measuring circuitry 108 may be combined.

Figure 2:
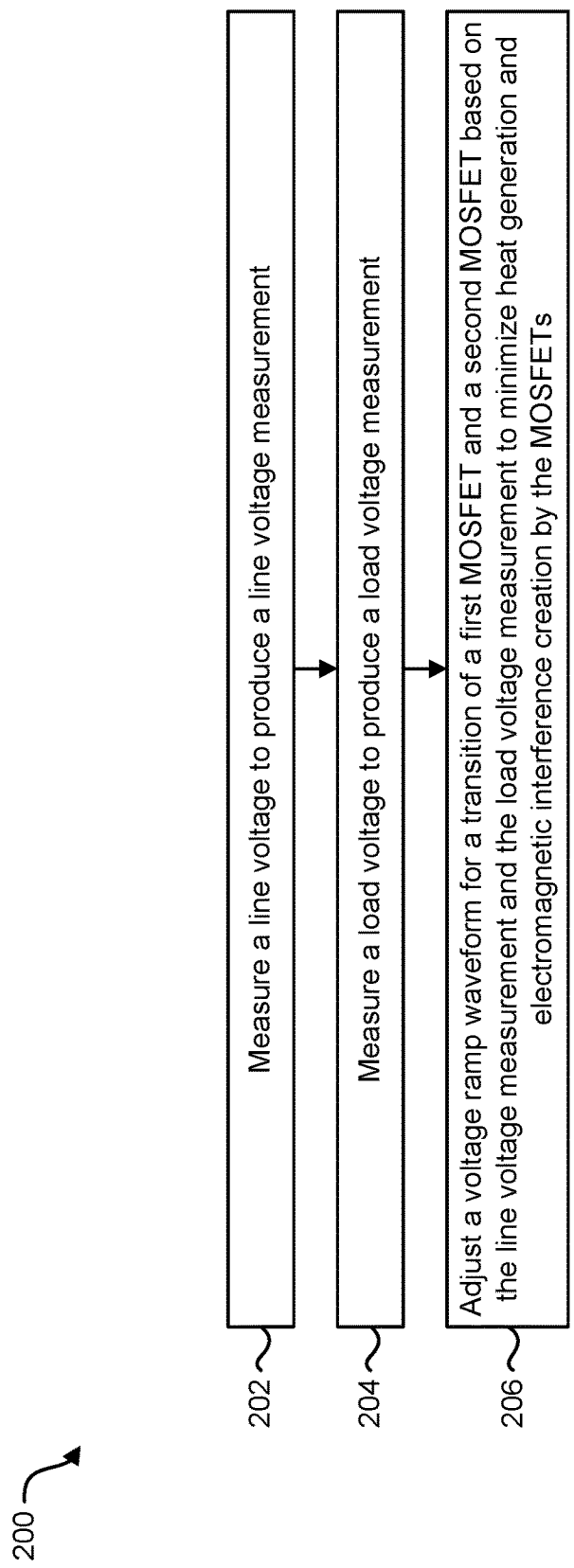
FIG. 2 is a flow diagram illustrating one configuration of a method for controlling MOSFETs.

FIG. 2 is a flow diagram illustrating one configuration of a method 200 for controlling MOSFETs 114. The method 200 may be performed by the electronic device 102 described in relation to FIG. 1. The electronic device 102 may measure 202 a line voltage to produce a line voltage measurement 124. This may be accomplished as described in relation to FIG. 1. For example, the electronic device 102 (e.g., line voltage measuring circuitry 106) may measure 202 the line voltage as a line voltage measurement 124 (e.g., a voltage waveform, a series of voltage data samples, etc.). The line voltage measurement 124 may indicate the line voltage (e.g., voltage across a source 110) for one or more cycles (e.g., AC voltage cycles).

The electronic device 102 may measure 204 a load voltage to produce a load voltage measurement 126. This may be accomplished as described in relation to FIG. 1. For example, the electronic device 102 (e.g., load voltage measuring circuitry 108) may measure 204 the load voltage as a load voltage measurement 126 (e.g., a voltage waveform, a series of voltage data samples, etc.). The load voltage measurement 126 may indicate the load voltage (e.g., voltage across a load 112) for one or more cycles (e.g., AC voltage cycles).

The electronic device 102 may adjust 206 a voltage ramp waveform 118 for a transition of a first MOSFET 114a and a second MOSFET 114b based on the line voltage measurement 124 and the load voltage measurement 126 to minimize heat generation and electromagnetic interference creation by the MOSFETs 114. The first MOSFET 114a and the second MOSFET 114b may control the current to the load 112 in an alternating current configuration. The electronic device 102 may adjust 206 the voltage ramp waveform 118 as described in relation to FIG. 1. For example, the processor 104 may adjust the voltage ramp waveform 118 in real time based on the line voltage measurement 124 and the load voltage measurement 126. A transition rate to transition the MOSFETs 114 from an on state to an off state or an off state to an on state may be determined by the processor 104. In some implementations, the processor 104 may provide the voltage ramp waveform 118 to an amplification and filtering block 116 coupled to the gate input of the first MOSFET 114a and the gate input of the second MOSFET 114b.

The processor 104 may adjust the voltage ramp waveform 118 to round final stages of an off/on transition or an on/off transition of the MOSFETs 114. For example, the voltage ramp waveform 118 may include a fast transition during initial stages of an off/on transition to minimize heat generation by the MOSFETs 114 and a rounded transition in the final stages of the off/on transition to reduce electromagnetic interference.

In some implementations, the processor 104 may adjust the voltage ramp waveform 118 using the equation log(time)$^X$, where X is based on a size of the load 112. X may vary between 0.1 and 1 based on the size of the load 112. The duration of the voltage ramp waveform 118 may be between 100 microseconds and 1000 microseconds. The voltage scale of the voltage ramp waveform 118 may be based on the size of the load 112. For example, the voltage ramp waveform 118 may be created over a voltage scale of 0.5 volts to 1.5 volts.

Figure 3:
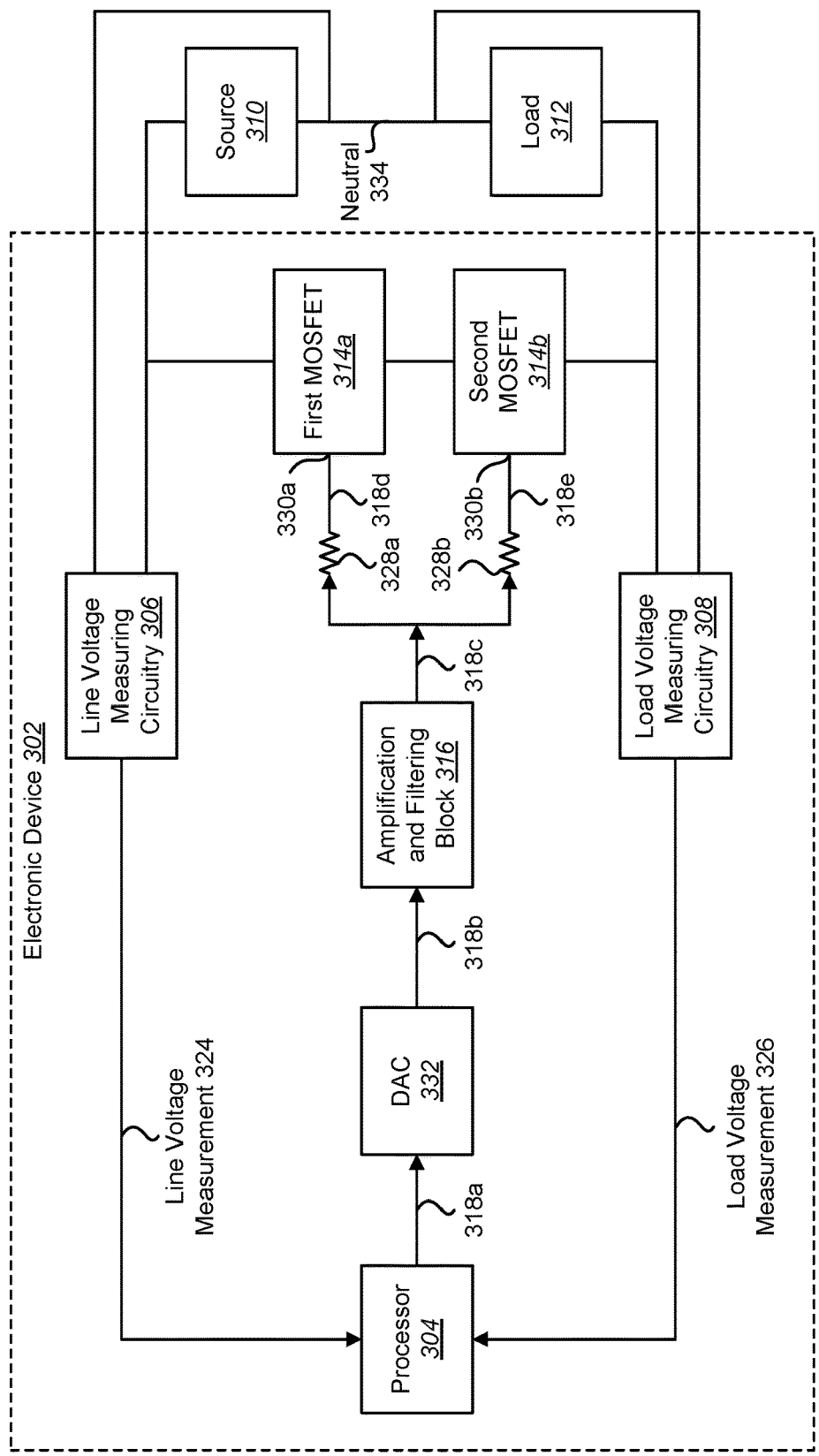
FIG. 3 is a block diagram illustrating a more specific configuration of an electronic device for controlling MOSFETs.

FIG. 3 is a block diagram illustrating a more specific configuration of an electronic device 302 for controlling MOSFETs 314. The electronic device 302 may include a processor 304, MOSFETs 314, line voltage measuring circuitry 306, load voltage measuring circuitry 308, an amplification and filtering block 316 and/or a DAC 332. The processor 304 may be coupled to the line voltage measuring circuitry 306, to the load voltage measuring circuitry 308, and/or to a DAC 332.

The electronic device 302 described in relation to FIG. 3 may be an example of the electronic device 102 described in relation to FIG. 1. One or more of the elements or components described in relation to FIG. 3 may function similarly and/or may be implemented similarly to one or more corresponding elements or components described in relation to FIG. 1. For example, the source 310, load 312, MOSFETs 314, processor 304, line voltage measuring circuitry 306, and/or load voltage measuring circuitry 308 of FIG. 3 may function and/or may be implemented as described in relation to one or more of the source 110, load 112, MOSFETs 114, processor 104, line voltage measuring circuitry 106, and/or load voltage measuring circuitry 108 of FIG. 1. It should be noted that the source 310 and/or the load 312 may be separate from the electronic device 302, may be coupled to the electronic device 302, and/or may not be included in the electronic device 302. The switching circuitry 314 may be coupled to the source 310 and the load 312. A neutral 334 line may be coupled between the source 310 and the load 312.

The line voltage measuring circuitry 306 is configured to measure the line voltage (i.e., the voltage across the source 310) to produce a line voltage measurement 324. The load voltage measuring circuitry 308 is configured to measure the load voltage (i.e., the voltage across the load 312) to produce a load voltage measurement 326.

The DAC 332 may receive a digital voltage ramp waveform 318a from the processor 304. The DAC 332 may convert the digital voltage ramp waveform 318a to an analog voltage ramp waveform 318b. The analog voltage ramp waveform 318b output of the DAC 332 may be a waveform that minimizes heat generation by the MOSFETs 314 while shaping sections of the switching circuitry transition to minimize electromagnetic interference creation.

The amplification and filtering block 316 may amplify the analog voltage ramp waveform 318b to voltage levels that are sufficient to drive the transition of the MOSFETs 314. The amplification and filtering block 316 may also smooth the steps of the analog voltage ramp waveform 318b using filtering. The amplification and filtering 316 may output an amplified and filtered voltage ramp waveform 318c.

In some implementations, resistors 328a-b may be coupled between the output of the amplification and filtering block 316 and the controlling gate input 330 of the MOSFETs 314. The resistors 328a-b may be placed between the driving circuitry and the MOSFETs 314 to minimize oscillation. For example, a first resistor 328a may be coupled between the output of the amplification and filtering block 316 and the gate input 330a of the first MOSFET 314a. A second resistor 328b may be coupled between the output of the amplification and filtering block 316 and the gate input 330b of the second MOSFET 314b. The gate input 330a of the first MOSFET 314a may receive the voltage ramp waveform 318d that passes through the resistor 328a. The gate input 330b of the second MOSFET 314b may receive the voltage ramp waveform 318e that passes through the resistor 328b. The amplified and filtered voltage ramp waveform 318c may be fed to the low-valued resistors 328a-b. In some implementations, the value of the resistors 328a-b may be kept below a certain resistance to prevent MOSFET-to-MOSFET interaction while being sufficient enough to minimize interaction with the capacitance of the MOSFET gates 330a-b. The value of the resistors 328a-b may be kept low to minimize interaction with the capacitance of the controlling input of the MOSFETs 314 so the MOSFETs 314 can be precisely controlled.

In some configurations, the processor 304, load voltage measuring circuitry 308, and/or line voltage measuring circuitry 306 may be utilized to adjust the voltage ramp waveform 318 for a transition of the MOSFETs 314. This may be accomplished as described in connection with FIG. 1. For example, in a notch approach, the processor 304 may adjust the voltage ramp waveform 318 based on the shape of the load voltage measurement 326. In this approach, the processor 304 may determine the proper point to apply the voltage ramp waveform 318 based on the shape of the load voltage measurement 326. The processor 304 may adjust the voltage ramp waveform 318 lower (e.g., offset voltage ramp waveform 318 down) when the load voltage measurement 326 develops a sharp edge at the beginning of the voltage ramp waveform 318. The processor 304 may adjust the voltage ramp waveform 318 higher (e.g., offset voltage ramp waveform 318 up) when the load voltage measurement 326 develops a notch at the end of the voltage ramp waveform 318. FIG. 6 illustrates an example of this notch approach.

In another example, the processor 304 may adjust the voltage ramp waveform 318 using a difference approach. In this approach, the processor 304 may adjust the voltage ramp waveform 318 based on a difference between the line voltage measurement 324 and the load voltage measurement 326. For example, the processor 304 may adjust a starting voltage of the voltage ramp waveform 318 until the difference between the line voltage measurement 324 and the load voltage measurement 326 is within a threshold at a number of points during the transition of the MOSFETs 314. FIG. 8 and FIG. 9 illustrate an example of this difference approach.

It should be noted that one or more of the elements or components described in relation to FIG. 3 may be combined and/or divided in some configurations. For example, the processor 304, MOSFETs 314, line voltage measuring circuitry 306, load voltage measuring circuitry 308, an amplification and filtering block 316 and/or a DAC 332 may be divided into smaller elements or components that perform a subset of the functions described herein. Additionally or alternatively, one or more of the processor 304, MOSFETs 314, line voltage measuring circuitry 306, load voltage measuring circuitry 308, an amplification and filtering block 316 and/or a DAC 332 may be combined. For example, the DAC 332 may be combined with the processor 304 in some configurations.

FIG. 4 illustrates an example of the voltage ramp waveform 418 and a resulting load voltage 422. FIG. 4 shows a region 440 where the MOSFET is off, a MOSFET transition region 442 (e.g., turning on) and a region 444 where the MOSFET is fully on. The shape of the voltage ramp waveform 418 may be generated by a processor 104 in a MOSFET driver and resistor circuit as described in connection with FIG. 1 and FIG. 3. The voltage ramp waveform 418 shows the voltage ramp on the MOSFET gate. The load voltage 422 is the resultant voltage delivered to the load 112 (e.g., lighting load).

The systems and method described herein allow for a fast initial transition (e.g., rise) during the initial stages of the transition. This fast initial rise may reduce heat generation and increase efficiency.

The peak and final stages of the transition may be rounded to reduce the majority of the electromagnetic interference. This may be observed in the load voltage 422 as a soft knee shape.

Figure 5:
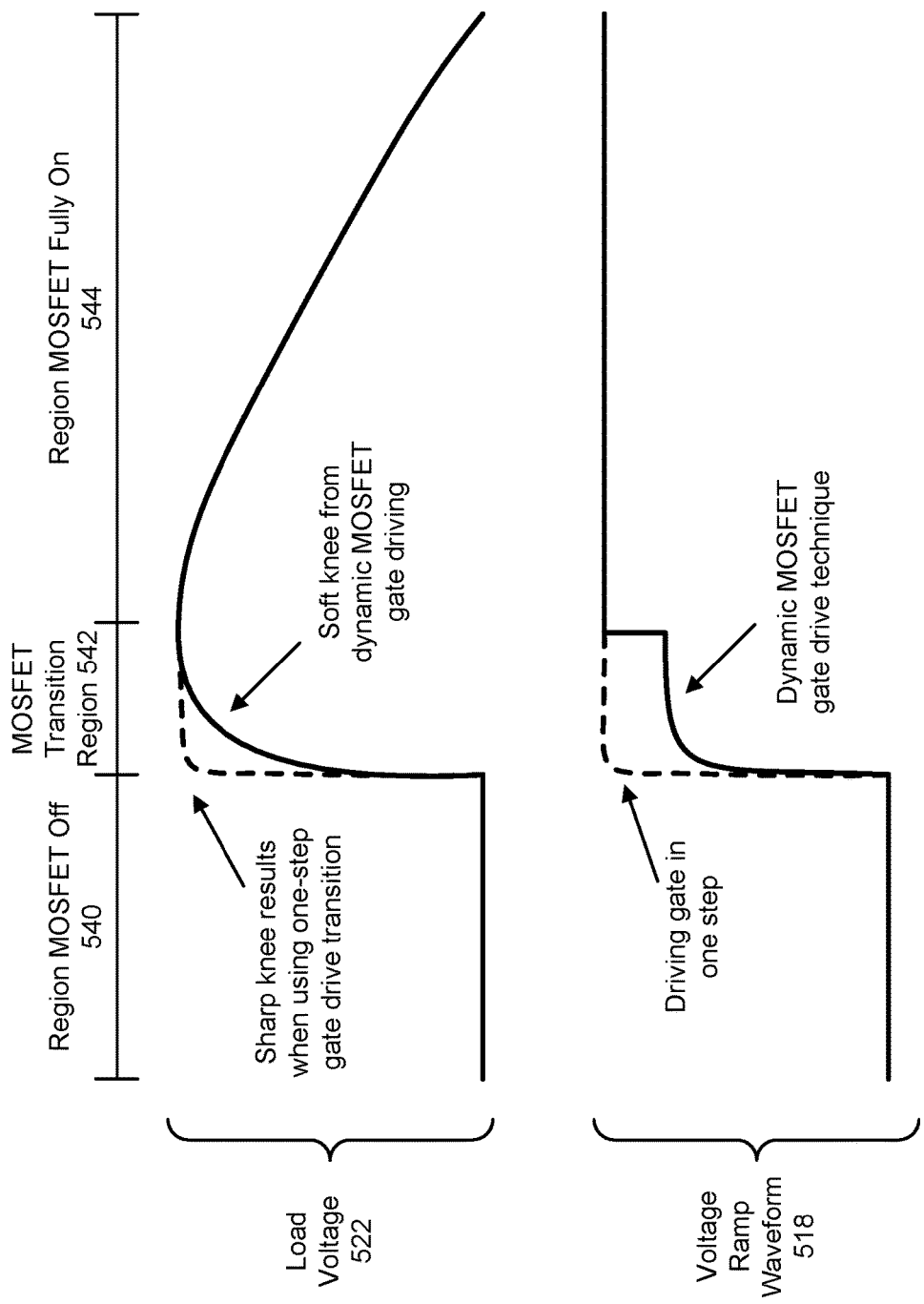
FIG. 5 illustrates dynamic MOSFET gate shaping compared to a one-step transition.

FIG. 5 illustrates dynamic MOSFET gate shaping compared to a one-step transition. FIG. 5 shows a region 540 where the MOSFET is off, a MOSFET transition region 542 (e.g., turning on region) and a region 544 where the MOSFET is fully on. The voltage ramp waveform 518 shows the voltage ramp on the MOSFET gate. The load voltage 522 is the resultant voltage delivered to the load 112 (e.g., lighting load).

The dashed line in FIG. 5 illustrates a quick one-step transition where the voltage at the MOSFET gate jumps from a low voltage to a high voltage in one step without a resistor at the gate of the MOSFET. This one-step transition is efficient but may not be acceptable for electromagnetic interference. For example, the electromagnetic interference generated by the one-step gate ramp may violate governmental regulations on allowable amounts of electromagnetic interference.

The dynamic MOSFET gate drive technique according to the systems and methods described herein matches the initial speed of the one-step transition while rounding out the problematic corner of the voltage load 522. This rounding of the voltage load 522 corner may reduce high electromagnetic interference while minimizing inefficient heat generation by the MOSFET.

FIG. 6 illustrates a notch approach for adjusting the voltage ramp waveform 618 to a MOSFET gate. FIG. 6 shows a region 640 where the MOSFET is off, a MOSFET transition region 642 (e.g., turning on region) and a region 644 where the MOSFET is fully on. The voltage ramp waveform 618 shows the voltage ramp on the MOSFET gate originating from the processor. The load voltage 622 is the resultant voltage delivered to the load (e.g., lighting load).

Multiple voltage ramp waveforms 618a-b are shown in FIG. 6 to show what corresponding load voltages 622a-d look like if the shape of the voltage ramp waveform 618 is too high or too low. If the shape of the voltage ramp waveform 618 starts at too high of a voltage, the load voltage 622 develops a sharp edge at the beginning of the ramp, as shown with voltage ramp waveform 618a and the resultant line voltage 622a. If the voltage ramp waveform 618 starts at too low of a voltage, the load voltage 622 develops a notch at the end of the ramp, as shown with voltage ramp waveforms 618c-d and the resultant line voltages 622c-d. The notch is a sharp jump in the load voltage 622 during the final stages of the MOSFET transition region 642.

The processor 104 may adjust the voltage ramp waveform 618 based on the load voltage measurement circuitry 108 until the load voltage 622 is smooth, which would be between voltage ramp waveforms 618b-c in this example. This voltage ramp waveform adjustment may be referred to as the notch approach for determining the proper ramp point.

Figure 7:
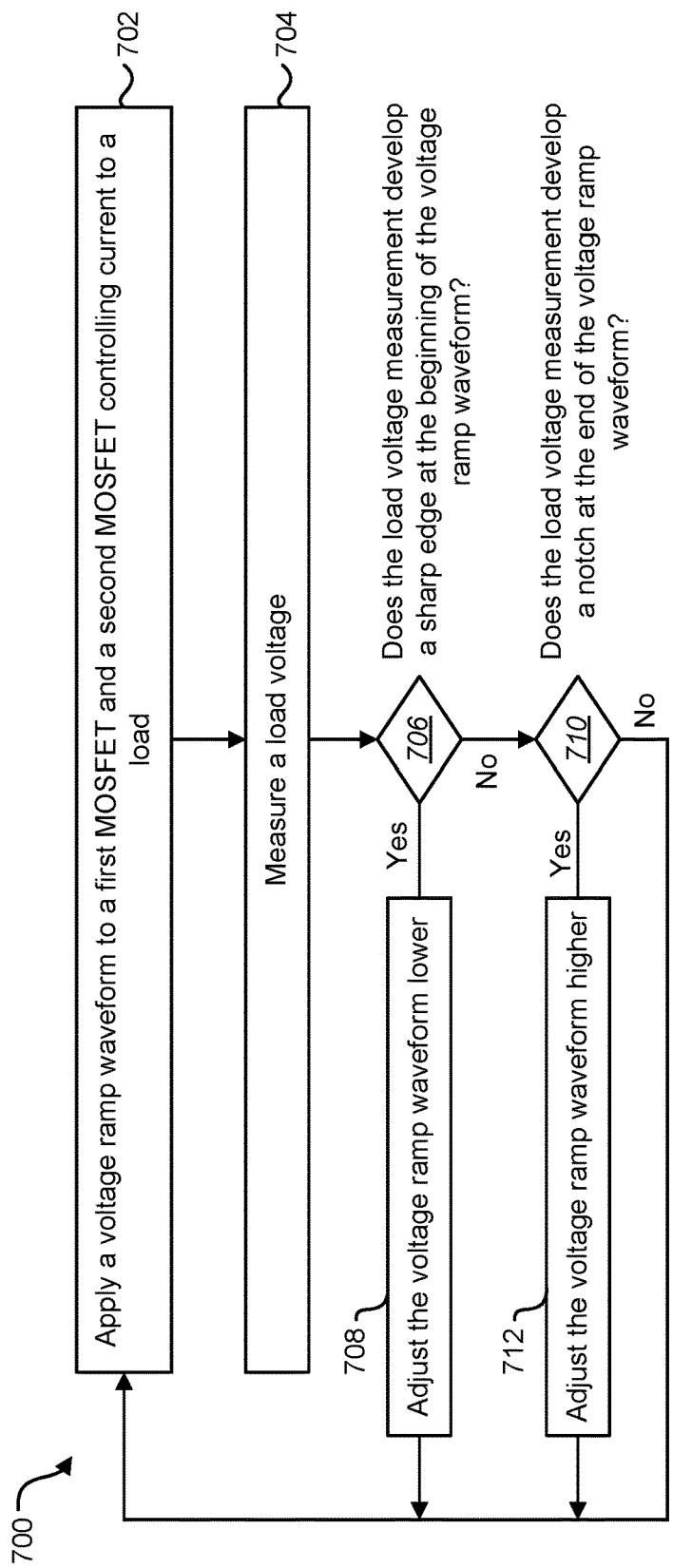
FIG. 7 is a flow diagram illustrating one configuration of a method for adjusting the voltage ramp waveform to a MOSFET gate according to a notch approach.

FIG. 7 is a flow diagram illustrating one configuration of a method 700 for adjusting the voltage ramp waveform 118 to a MOSFET gate 330 according to a notch approach. The method 700 may be performed by the electronic device 102 described in relation to FIG. 1 or the electronic device 302 described in relation to FIG. 3.

The electronic device 102 may apply 702 a voltage ramp waveform 118 to a first MOSFET 114a and a second MOSFET 114b controlling current to a load 112. This may be accomplished as described in connection with FIG. 1. For example, a processor 104 of the electronic device 102 may generate a voltage ramp waveform 118 to minimize heat generation and electromagnetic interference creation by the MOSFETs 114. In an implementation, the processor 104 may generate the voltage ramp waveform 118 using the equation $\log(\text{time})^X$, where X is based on a size of the load 112.

The electronic device 102 may measure 704 a load voltage. For example, load voltage measuring circuitry 108 may be configured to measure the load voltage to produce a load voltage measurement 326. The load voltage measurement 326 may be provided to the processor 104.

The electronic device 102 may determine 706 whether the load voltage measurement 326 develops a sharp edge at the beginning of the voltage ramp waveform 118. For example, the processor 104 may determine 706 whether the shape of the load voltage has a sharp edge during the initial stages of an off/on transition of the MOSFETs 114.

If the load voltage measurement 326 develops a sharp edge at the beginning of the voltage ramp waveform 118, then the electronic device 102 may adjust 708 the voltage ramp waveform 118 lower. For example, the processor 104 may offset the voltage ramp waveform 118 lower. The electronic device 102 may then continue to apply 702 the adjusted voltage ramp waveform 118 to the first MOSFET 114a and the second MOSFET 114b.

If the electronic device 102 determines 706 that the load voltage measurement 326 does not develop a sharp edge at the beginning of the voltage ramp waveform 118, then the electronic device 102 may determine 710 whether the load voltage measurement 326 develops a notch at the end of the voltage ramp waveform 118. For example, the processor 104 may determine 710 whether the shape of the load voltage has a sharp jump (e.g., notch) during the final stages of an off/on transition of the MOSFETs 114.

If the load voltage measurement 326 develops a notch at the end of the voltage ramp waveform 118, then the electronic device 102 may adjust 712 the voltage ramp waveform 118 higher. For example, the processor 104 may offset the voltage ramp waveform 118 higher. The electronic device 102 may then continue to apply 702 the adjusted voltage ramp waveform 118 to the first MOSFET 114a and the second MOSFET 114b.

FIG. 8 and FIG. 9 illustrate a difference approach for adjusting the voltage ramp waveform 118 to a MOSFET gate. FIG. 8 shows the line voltage 820 and load voltage 822 in a region 840 where the MOSFET is off, a MOSFET transition region 842 (e.g., turning on region) and a region 844 where the MOSFET is fully on. FIG. 9 shows the line voltage 920 and load voltage 922 in a region 948 where the MOSFET is on, a MOSFET transition region 950 (e.g., turning off region) and a region 952 where the MOSFET is fully off.

In FIG. 8, the MOSFET turns on midway into the AC cycle, called forward phase. In FIG. 9 the MOSFET turns off midway into the AC cycle, called reverse phase. When the MOSFETs are off, the difference between line voltage and load voltage is large but this difference goes to near zero when the MOSFETs are on. In the example of FIG. 8, the processor may determine the difference between the line voltage 820 and the load voltage 822 at three sampling points 846a-c during the off/on transition. In the example of FIG. 9, the processor may determine the difference between the line voltage 920 and the load voltage 922 at three sampling points 946a-c during the on/off transition.

In both forward and reverse phase modes, the processor may adjust the starting voltage of the voltage ramp waveform 118 at the MOSFET gate until the difference between line voltage 820, 920 and load voltage 822, 922 is within a threshold at a number of points during the off/on or on/off transition. In some implementations, the sign of the difference between line voltage 820, 920 and load voltage 822, 922 may be used to determine whether to adjust (e.g., offset) the voltage ramp waveform 118 up or down. If the difference is greater than a threshold, the offset applied to the DAC may be adjusted up. If the difference is less than a threshold, the offset applied to the DAC may be adjusted down. The sign and magnitude of the difference between line voltage 820, 920 and load voltage 822, 922 may be continuously monitored and the voltage ramp waveform 118 adjusted accordingly.

Once these thresholds are within a tolerance level, the processor knows that it has placed the correct offset to the voltage ramp waveform at the MOSFET gate ramp to shape the load voltage properly. It should be noted that noise on the power line 111 rides on both the line and load voltages. The difference between the line and load voltages does not include the power line noise.

Figure 10:
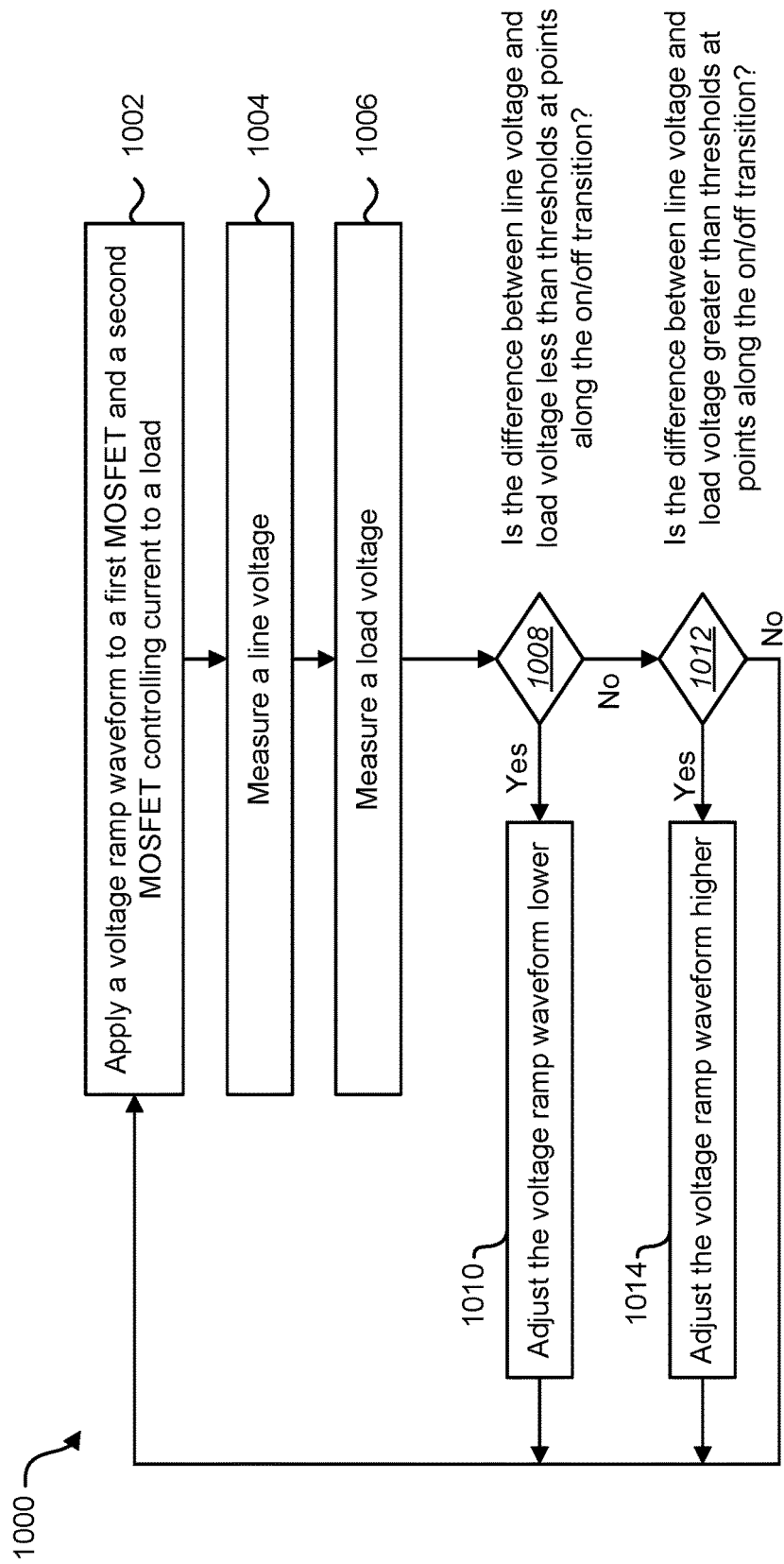
FIG. 10 is a flow diagram illustrating one configuration of a method for adjusting the voltage ramp waveform to a MOSFET gate according to a difference approach.

FIG. 10 is a flow diagram illustrating one configuration of a method 1000 for adjusting the voltage ramp waveform 118 to a MOSFET gate 330 according to a difference approach. The method 1000 may be performed by the electronic device 102 described in relation to FIG. 1 or the electronic device 302 described in relation to FIG. 3.

The electronic device 102 may apply 1002 a voltage ramp waveform 118 to a first MOSFET 114a and a second MOSFET 114b controlling current to a load 112. This may be accomplished as described in connection with FIG. 1.

The electronic device 102 may measure 1004 a line voltage to produce a line voltage measurement 124. This may be accomplished as described in relation to FIG. 1. For example, the electronic device 102 (e.g., line voltage measuring circuitry 108) may measure 1004 the line voltage as a voltage waveform, a series of voltage data samples, etc.

The electronic device 102 may measure 1006 a load voltage to produce a load voltage measurement 126. This may be accomplished as described in relation to FIG. 1. For example, the electronic device 102 (e.g., load voltage measuring circuitry 108) may measure 1006 the load voltage as a voltage waveform, a series of voltage data samples, etc.

The electronic device 102 may determine 1008 whether the difference between the line voltage measurement 124 and the load voltage measurement 126 is less than thresholds at points along the on/off transition. This may be accomplished as described in connection with FIG. 8 and FIG. 9. For example, the processor 104 may determine the difference between the line voltage measurement 124 and the load voltage measurement 126 at a number of sampling points during the on/off transition or off/on transition. If the difference between the line voltage measurement 124 and the load voltage measurement 126 is less than thresholds at the sampling points, the electronic device 102 may adjust 1010 (e.g., offset) the voltage ramp waveform 118 lower. For example, if the difference is less than a threshold, the offset applied to the DAC may be adjusted down. The electronic device 102 may then continue to apply 1002 the adjusted voltage ramp waveform 118 to the first MOSFET 114a and the second MOSFET 114b.

If the electronic device 102 determines 1008 that the difference between the line voltage measurement 124 and the load voltage measurement 126 is not less than thresholds at points along the on/off transition, then the electronic device 102 may determine 1012 whether the difference between the line voltage measurement 124 and the load voltage measurement 126 is greater than thresholds at points along the on/off transition. This may be accomplished as described in connection with FIG. 8 and FIG. 9. For example, the processor 104 may determine the difference between the line voltage measurement 124 and the load voltage measurement 126 at a number of sampling points during the on/off transition or off/on transition. If the difference between the line voltage measurement 124 and the load voltage measurement 126 is greater than thresholds at the sampling points, the electronic device 102 may adjust 1014 (e.g., offset) the voltage ramp waveform 118 higher. For example, if the difference is greater than a threshold, the offset applied to the DAC may be adjusted up. The electronic device 102 may then continue to apply 1002 the adjusted voltage ramp waveform 118 to the first MOSFET 114a and the second MOSFET 114b.

Figure 11:
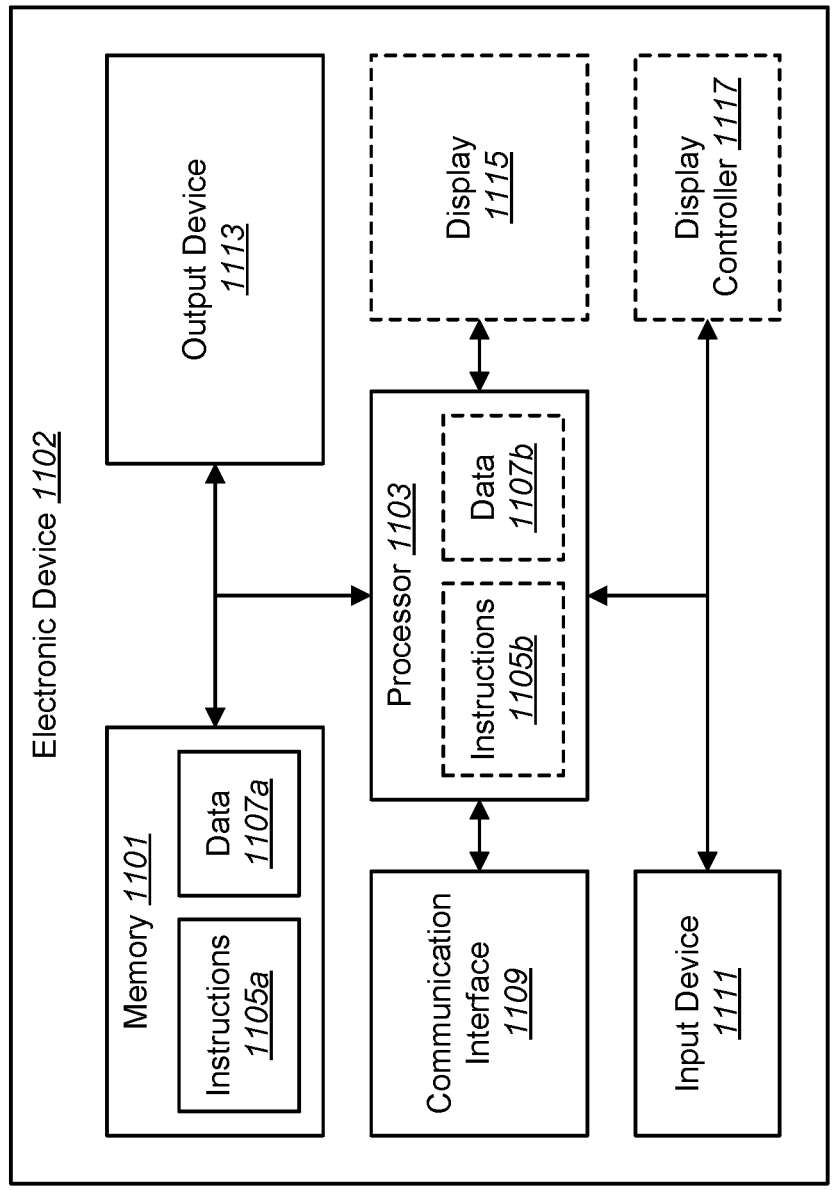
FIG. 11 illustrates various components that may be utilized in an electronic device.

FIG. 11 illustrates various components that may be utilized in an electronic device 1102. The electronic device 1102 described in connection with FIG. 11 may be configured in accordance with one or more of the electronic devices 102, 302 described herein. For example, the electronic device 1102 may be configured to perform one or more of the methods 200, 700 and 1000 described above. The electronic device 1102 may include a memory 1101, a communication interface 1109, an input device 1111, a processor 1103, an output device 1113, a display 1115, and/or a display controller 1117. The memory 1101 may store instructions 1105a and data 1107a. The processor 1103 may operate on instructions 1105b and data 1107b. It should be noted that the display 1115 and/or display controller 1117 may be optional. For example, some configurations of the electronic device 1102 may not have a display. Additionally or alternatively, some configurations of the electronic device 1102 may include a button interface (e.g., an input device 1111). Some configurations of the electronic device 1102 may be controlled on a remote display device (e.g., a touch panel) with communication through a remote device (e.g., a controller, home automation controller, etc.).

The term "discrete circuit" refers to an electronic circuit built out of discrete components. Examples of discrete components include resistors, capacitors, inductors, transformers, transistors, etc. In some configurations, a discrete circuit may not be a solid state integrated circuit that performs all of the functions described herein. However, a discrete circuit may include one or more discrete components contained in the same packaging (e.g., bridge rectifier, solid state relay, etc.). In some configurations, a discrete circuit made from discrete components refers to a circuit having separate components or circuits that perform individual finite functions. For instance, examples of a discrete circuit may include load voltage measuring circuitry, switching circuitry, a processor, line voltage measuring circuitry, and/or current measuring circuitry that may perform separate and discrete functions while being implemented within an electronic device. An electronic device may be housed within a wall box. Moreover, each module within an electronic device may include discrete components or discrete circuits. In some instances, the term "circuit" may refer to a circuit in its entirety, for example, including the impedance of the wall box device and the impedance of the load.

The term "processor" should be interpreted broadly to encompass a general purpose processor, a central processing unit (CPU), a microprocessor, a digital signal processor (DSP), a controller, a microcontroller, a state machine, and so forth. Under some circumstances, a "processor" may refer to an application specific integrated circuit (ASIC), a programmable logic device (PLD), a field programmable gate array (FPGA), etc. The term "processor" may refer to a combination of processing devices, e.g., a combination of a DSP and a microprocessor, a plurality of microprocessors, one or more microprocessors in conjunction with a DSP core, or any other such configuration.

The term "memory" should be interpreted broadly to encompass any electronic component capable of storing electronic information. The term memory may refer to various types of processor-readable media such as random access memory (RAM), read-only memory (ROM), non-volatile random access memory (NVRAM), programmable read-only memory (PROM), erasable programmable read-only memory (EPROM), electrically erasable PROM (EEPROM), flash memory, magnetic or optical data storage, registers, etc. Memory is said to be in electronic communication with a processor if the processor can read information from and/or write information to the memory. Memory that is integral to a processor is in electronic communication with the processor.

The terms "instructions" and "code" should be interpreted broadly to include any type of computer-readable statement(s). For example, the terms "instructions" and "code" may refer to one or more programs, routines, subroutines, functions, procedures, etc. "Instructions" and "code" may comprise a single computer-readable statement or many computer-readable statements.

The term "computer-readable medium" refers to any available medium that can be accessed by a computer or processor. A computer-readable medium may be non-transitory and tangible. By way of example, and not limitation, a computer-readable medium may comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk, and Blu-Ray® disc where disks usually reproduce data magnetically, while discs reproduce data optically with lasers.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of transmission medium.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

It is to be understood that the claims are not limited to the precise configuration and components illustrated above. Various modifications, changes, and variations may be made in the arrangement, operation, and details of the systems, methods, and apparatus described herein without departing from the scope of the claims.

What is claimed is:

1. An electronic device, comprising:
    line voltage measuring circuitry configured to measure a line voltage to produce a line voltage measurement;
    load voltage measuring circuitry configured to measure a load voltage to produce a load voltage measurement; and
    a processor coupled to the line voltage measuring circuitry and the load voltage measuring circuitry, wherein the processor is configured to adjust a voltage ramp waveform for a transition of a first metal-oxide-semiconductor field-effect transistor (MOSFET) and a second MOSFET based on the line voltage measurement and the load voltage measurement to minimize heat generation and electromagnetic interference creation by the MOSFETs, wherein the first MOSFET and the second MOSFET control a current to a load in an alternating current configuration, wherein the processor adjusts the voltage ramp waveform based on a difference between the line voltage measurement and the load voltage measurement.

2. The electronic device of claim 1, wherein the processor provides the voltage ramp waveform to an amplification and filtering block coupled to a gate input of the first MOSFET and a gate input of the second MOSFET.

3. The electronic device of claim 1, wherein the processor adjusts the voltage ramp waveform in real time based on the line voltage measurement and the load voltage measurement.

4. The electronic device of claim 1, wherein the processor adjusts the voltage ramp waveform to round final stages of an off/on transition or an on/off transition of the MOSFETs.

5. The electronic device of claim 4, wherein the voltage ramp waveform comprises a fast transition during initial stages of an off/on transition to minimize heat generation by the MOSFETs and a rounded transition in the final stages of the off/on transition to reduce electromagnetic interference.

6. The electronic device of claim 1, wherein the processor adjusts the voltage ramp waveform using the equation $\log(\text{time})^X$, where X is based on a size of the load.

7. The electronic device of claim 6, wherein X varies between 0.1 and 1.

8. The electronic device of claim 6, wherein the voltage ramp waveform comprises a duration between 100 microseconds and 1000 microseconds.

9. The electronic device of claim 6, wherein a voltage scale of the voltage ramp waveform is based on a size of the load.

10. The electronic device of claim 1, wherein the processor adjusts the voltage ramp waveform lower when the load voltage measurement develops a sharp edge at the beginning of the voltage ramp waveform.

11. The electronic device of claim 1, wherein the processor adjusts the voltage ramp waveform higher when the load voltage measurement develops a notch at the end of the voltage ramp waveform.

12. The electronic device of claim 1, wherein the processor adjusts a starting voltage of the voltage ramp waveform until a difference between the line voltage measurement and the load voltage measurement is within a threshold at a number of points during the transition of the MOSFETs.

13. A method, comprising:
measuring a line voltage to produce a line voltage measurement;
measuring a load voltage to produce a load voltage measurement; and
adjusting a voltage ramp waveform for a transition of a first metal-oxide-semiconductor field-effect transistor (MOSFET) and a second MOSFET based on the line voltage measurement and the load voltage measurement to minimize heat generation and electromagnetic interference creation by the MOSFETs, wherein the first MOSFET and the second MOSFET control a current to a load in an alternating current configuration, wherein the voltage ramp waveform is adjusted lower when the load voltage measurement develops a sharp edge at the beginning of the voltage ramp waveform.

14. The method of claim 13, wherein the voltage ramp waveform is adjusted to round final stages of an off/on transition or an on/off transition of the MOSFETs.

15. The method of claim 13, wherein the voltage ramp waveform is adjusted using the equation $\log(\text{time})^X$, where X is based on a size of the load.

16. The method of claim 13, wherein the voltage ramp waveform is adjusted higher when the load voltage measurement develops a notch at the end of the voltage ramp waveform.

17. The method of claim 13, wherein the voltage ramp waveform is adjusted based on a difference between the line voltage measurement and the load voltage measurement at a number of points during the transition of the MOSFETs.

18. A non-transitory computer-readable medium, the computer-readable medium comprising executable instructions for:
measuring a line voltage to produce a line voltage measurement;
measuring a load voltage to produce a load voltage measurement; and
adjusting a voltage ramp waveform for a transition of a first metal-oxide-semiconductor field-effect transistor (MOSFET) and a second MOSFET based on the line voltage measurement and the load voltage measurement to minimize heat generation and electromagnetic interference creation by the MOSFETs, wherein the first MOSFET and the second MOSFET control a current to a load in an alternating current configuration, wherein the voltage ramp waveform is adjusted higher when the load voltage measurement develops a notch at the end of the voltage ramp waveform.

\* \* \* \* \*